United States Patent
Klaka et al.

[11] Patent Number: 5,977,568
[45] Date of Patent: Nov. 2, 1999

[54] POWER SEMICONDUCTOR COMPONENT WITH A PRESSURE-EQUALIZING CONTACT PLATE

[75] Inventors: Sven Klaka; Jan Voboril, both of Nussbaumen, Switzerland

[73] Assignee: Asea Brown Boveri AG, Baden, Switzerland

[21] Appl. No.: 09/116,928

[22] Filed: Jul. 17, 1998

[30] Foreign Application Priority Data

Jul. 30, 1997 [DE] Germany ............... 197 32 738

[51] Int. Cl.⁶ ............... H01L 29/74; H01L 23/48; H01L 23/06; H01L 23/16
[52] U.S. Cl. ............... 257/108; 257/785; 257/729; 257/683
[58] Field of Search ............... 257/108, 785, 257/683, 729

[56] References Cited

U.S. PATENT DOCUMENTS

| | | |
|---|---|---|
| 4,254,431 | 3/1981 | Babuka et al. . |
| 4,500,907 | 2/1985 | Takigami et al. . |
| 4,903,886 | 2/1990 | Schwarzbauer . |
| 5,539,220 | 7/1996 | Takahashi . |

FOREIGN PATENT DOCUMENTS

| | | |
|---|---|---|
| 0025612A1 | 3/1981 | European Pat. Off. . |
| 0122431A1 | 10/1984 | European Pat. Off. . |
| 2630320 | 1/1978 | Germany . |
| 2840399 | 3/1980 | Germany . |
| 3209-174A | 9/1983 | Germany ............... 257/785 |
| 4227063A1 | 2/1994 | Germany . |
| 5-283717 | 10/1993 | Japan . |

OTHER PUBLICATIONS

"Composite Elastomeric Pressure Connector", IBM TDB vol. 36 No. 07, Jul. 1993.

*Primary Examiner*—Teresa M. Arroyo
*Attorney, Agent, or Firm*—Burns, Doane, Swecker & Mathis, L.L.P.

[57] ABSTRACT

The present invention discloses a power semiconductor component 1 having a special pressure contact system which is suitable, for example, for circuit-breakers, rectifiers, or the like in industrial drives. A pressure-equalizing element 9 in the form of a box 10, 15 with a flowable or plastically deformable medium 12 is inserted between a pressure plunger 7a and a power semiconductor 2. Because of the hydrostatic pressure in the box 10, an inhomogeneous pressure delivered at one side is passed on to the other side as a homogeneous pressure. A homogeneous pressure delivery can be achieved, even in the edge region of the pressure surfaces 11a, 11b, by means of an inlet camber of the lateral surface 13. The box 10, 15 preferably consists of copper or AlSiC, and the medium 12 of a liquid metal (Ga, Hg), a plastic metal (Pb, Al) or of metal balls (Cu) in silicone oil. The box can be arranged on one or both sides of one or more power semiconductors 2, and can also replace the molybdenum disks 3a, 3b or contact plates 4a, 4b.

15 Claims, 3 Drawing Sheets

POWER SEMICONDUCTOR COMPONENT WITH A PRESSURE-EQUALIZING CONTACT PLATE

BACKGROUND OF THE INVENTION

1. Field of the Invention

The present invention relates to the field of power electronics. It proceeds from a power semiconductor component having pressure contact plungers according to the preamble of claim 1.

2. Discussion of Background

Power semiconductors for industrial, tractive and other applications frequently include power semiconductor components such as, for example, thyristors, GTOs (gate turn-off thyristors), MCTs (MOS-controlled thyristors), power diodes, IGBTs (insulated gate bipolar transistors) or MOSFETs (MOS-controlled field effect transistors), which are encapsulated in a housing having pressure contacts. Such pressure housings can include, for example, a large-area thyristor or a plurality of small-area MOS-controlled semiconductor chips.

Such a power semiconductor component is disclosed, for example, in U.S. Pat. No. 4,500,907. The typical design comprises a semiconductor wafer with metallized power contacts, contact plates bearing on both sides and two cylindrical metal plungers by means of which the arrangement is held together in a housing. The contact plates consist of molybdenum (Mo) or tungsten (W) having a coefficient of expansion matched to silicon. The metal plungers serve the purpose of making electric and thermal pressure contact with the power semiconductor and of dissipating heat to a heat sink. The required high contact pressures lead to the known problem that damaging excess pressures can occur in the semiconductor wafer at the edge of its contact surface with the rigid contact plate. It is proposed as a solution to mill in a groove, for example a rectangular, V-shaped or arcuate one, on the circumference of the metal plunger, in order in conjunction with homogeneous pressure loading from outside to achieve pressure relief at the edge side by elastic deformation of the groove.

Proposed in U.S. Pat. No. 5,539,220 is a flat pressure housing for several semiconductor elements arranged next to one another, in which the contacting and heat dissipation are provided by pressing on large-area, common electrode plates. Such a pressure contact housing is preferably fitted with several IGBT chips and a free-wheeling diode. Advantages of said design relate to improving the heat dissipation and eliminating the bond wires and their inductances. Thermoplastic or solder layers between the electrode plates and semiconductors, and matching the overall height of IGBTs and free-wheeling diodes are disclosed as measures for ensuring homogeneous contact pressure over all structural elements.

Further reaching problems owing to inhomogeneities in the contact pressure impressed from outside onto the components remain unsolved in both publications. This relates first and foremost to unevennesses in contact plates and nonuniformly acting clamping devices. If a contact plate or a clamping device is deformed, or should they become deformed in the course of time owing to a change in load, material fatigue or the like, the result is a nonuniform distribution of the contact pressure over individual or several power semiconductor surfaces. This can lead to local overheating and to the failure of a semiconductor element. In the case of GTOs, for example, one of the most frequent causes of failure is the deformation acquired by the contact plates and metal plungers during operation. Thus, 10 mm thick contact plates made from copper can have unevennesses of 100 µm or more. Slight deformations of the contact plates already occur, however, when they are being tested before installation.

SUMMARY OF THE INVENTION

Accordingly, one object of the invention is to provide a novel power semiconductor component having special contact making by means of which the homogeneity of the pressure distribution over the surface of the power semiconductor is conspicuously improved. This object is achieved according to the invention by means of the features of claim 1.

Specifically, the core of the invention is to insert into a pressure-contacted power semiconductor component a pressure-equalizing element which contains a flowable or plastically deformable medium by means of which an inhomogeneous pressure delivered from one side is passed on to the other side as a homogeneous pressure.

An exemplary embodiment exhibits a power semiconductor component having a pressure-equalizing element arranged on one side in the form of a box which is filled with a liquid or plastic metal or with metal balls.

In a further exemplary embodiment, a pressure-equalizing element is specified in the form of a box with an inwardly cambered, arcuate lateral surface, which element is distinguished by a uniform pressure distribution even in the edge zone.

Another exemplary embodiment exhibits a box open on one side or a wall in which a soft plastic metal is held.

Other exemplary embodiments which relate, inter alia, to possible configurations and arrangements of the pressure-equalizing box and to the selection of the filling medium follow from the dependent claims.

One advantage of the power semiconductor component according to the invention consists in the improved protection of the power semiconductors against mechanical or thermal damage owing to inhomogeneous pressure loads.

A further advantage consists in that both static and variable inhomogeneous pressure distributions can be compensated, at least largely, in a passive way.

A further advantage is to be seen in that pressure-equalizing elements according to the invention permit an arrangement of several power semiconductors next to one another or one above another in a common pressure contact housing in a simple, reliable and gentle way.

BRIEF DESCRIPTION OF THE DRAWINGS

A more complete appreciation of the invention and many of the attendant advantages thereof will be readily obtained as the same becomes better understood by reference to the following detailed description when considered in connection with exemplary embodiments and the accompanying drawings, wherein.

DESCRIPTION OF THE PREFERRED EMBODIMENTS

Figure 1:
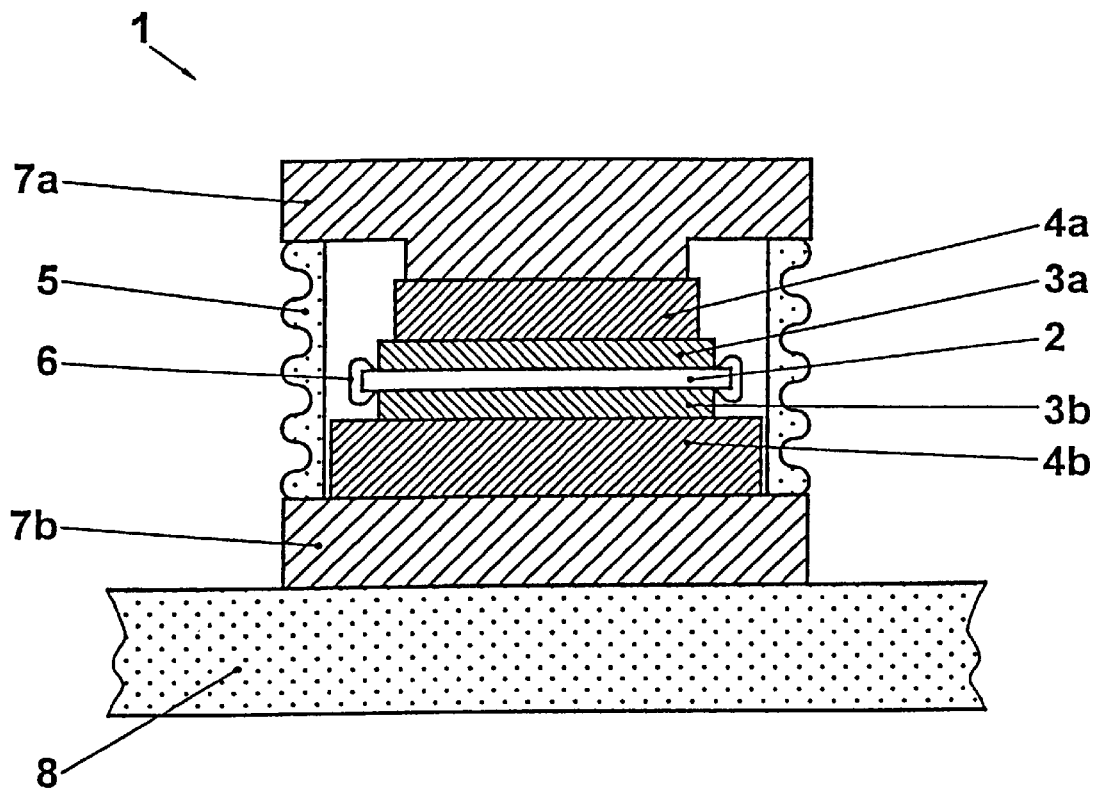
FIG. 1 shows a detail of a pressure-contacted power semiconductor component (prior art)

Referring now to the drawings, wherein like reference numerals designate identical or corresponding parts throughout the several views, FIG. 1 shows a detail of a known power semiconductor component 1 having at least one power semiconductor 2 and an arrangement on two sides of pressure contact elements 3a, 3b, 4a, 4b, in particular molybdenum disks 3a, 3b and contact plates 4a, 4b, as well as pressure plungers 7a, 7b made from copper. The power semiconductor 2 is dielectrically protected at the edge by a rubber ring 6 and accommodated in a ribbed ceramic insulator 5 together with the molybdenum disks 3a, 3b and contact plates 4a, 4b. The plungers 7a, 7b are pressed against one another under a very high contact pressure of approximately 100 bars, for example by disk springs (not represented) for the purpose of providing good electric and thermal pressure contact. Even small unevennesses in the molybdenum disks 3a, 3b or the contact plates 4a, 4b can cause the semiconductor wafer 2 to be damaged mechanically by local pressure peaks, or thermally by instances of local pressure relief and an increase in resistance resulting therefrom. Furthermore, the component 1 is subjected to temperature fluctuations of 100° C. and more during load cycles. Through thermal expansion, material fatigue, material distortion, bimetallic effects, etc., this can cause an inhomogeneity in the pressure distribution impressed from outside, which is passed on as far as the power semiconductor 2 if it is not balanced by flexible sagging of elements (3a, 3b, 4a, 4b, 7a, 7b) situated therebetween. In the case of conventional design, however, said elements are relatively rigid. If several power semiconductors 2 are stacked one above another or arranged next to one another on a carrier plate 8 and brought into contact in a common pressure contact housing via two or more pressure plungers 7a, 7b, such pressure inhomogeneities can accumulate and limit the extent to which a pressure contact housing can be used, or render such use completely impossible.

It is the object of the invention to specify a pressure-equalizing contact plate or a pressure-equalizing pressure contact element or pressure-equalizing element 9 which passes on to the other side as a uniform pressure an inhomogeneous pressure delivered from one side. It is also desirable for the pressure-equalizing element 9 to be able to compensate mechanical deformations. Moreover, the pressure-equalizing element 9 is to have a good electric and, in particular, thermal conductivity, in order to be suitable to conduct high currents in the kA range and as far as possible to dissipate the losses in the kW range.

Figure 2:
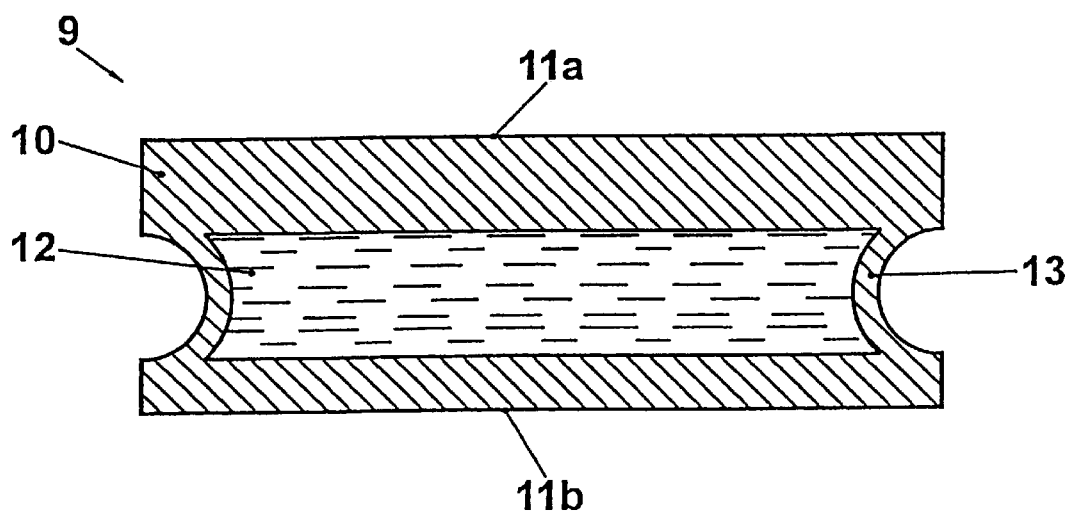
FIG. 2 shows a section through a pressure-equalizing element according to the invention.

One preferred embodiment is represented in FIG. 2. A box 10 having an upper and lower pressure surface 11a, 11b is filled inside with a flowable or plastically deformable medium 12. The box can consist, for example, of copper, and contain mercury (Hg) or lead (Pb). If, for example, the upper pressure surface 11a is stressed by a nonuniform pressure, a hydrostatic pressure builds up in the interior of the box and forms the required counterforce together with the force directed via the lateral surface 13. Because of the viscosity or plasticity of the medium 12, the hydrostatic pressure is transmitted onto the lower pressure surface 11b in a uniformly distributed fashion. Consequently, only the lateral surface 13 can still act as a source of inhomogeneities in the pressure distribution on the lower surface 11b. If the side wall 13 is rigid and, moreover, orientated perpendicularly, it will directly pass on to the lower edge strip 14 the pressure bearing on the edge side at the top, in particular the portion, supported via the lateral surface 13, of the elastic restoring force of the pressure surface 11a. Conversely, an elastic or fully flexible wall will transmit only little pressure or none at all onto the lower edge strip 14. The elasticity of the pressure plates 11a, 11b and of the lateral surface 13, as well as the compressibility of the medium 12 are advantageously tuned to one another such that the spring deflection of the box 10 is less than 1 mm, preferably less than 0.2 mm in the case of the required high pressures, and the force is chiefly transmitted via the medium 12. It is therefore sensible to select an incompressible or only slightly compressible filling medium 12.

Mechanical deformations can be caused, in particular locally, by unevennesses in the pressure contact elements 3a, 3b, 4a, 4b, in particular of the molybdenum disks 3a, 3b and contact plates 4a, 4b, or in the pressure plungers 7a, 7b or globally by a nonuniformly acting clamping device. The local deformations are mainly absorbed by the elasticity of the pressure surfaces 11a, 11b, and the global deformations mainly by a wedge-shaped inclination of the pressure surfaces because of the elasticity of the side wall 13. In both cases, the medium 12 will be deflected and/or compressed. Deformations of the order of magnitude of the spring deflection path are typically capable of being effectively compensated.

The box 10 is intended to ensure, alone or together with the medium 12, an adequate electric, and in particular thermal conductivity of the pressure-equalizing element 9. Consequently, the box 10 must have at least an electrically conductive cover 11a or bottom 11b. It can consist entirely or partly of a metal, for example copper, or a metal ceramic. In particular, it can comprise a cover 11a or bottom 11b or a trough 15 (see FIG. 6) made from a material with a coefficient of thermal expansion matched to the power semiconductor 2, such as molybdenum, tungsten or AlSiC, for example.

In addition to Hg and Pb, consideration is given, in particular, to gallium (Ga), tin (Sn), aluminum (Al), indium (In), a metal alloy or another liquid or plastically deformable metal or a mixture come into consideration as filling medium. As an alternative or in addition thereto, it is also possible to provide a mixed filling of metal balls, for example made from copper, with a diameter of a few 0.1 mm in a thermally conducting liquid or paste, for example silicone oil or silicone vaseline. Such a mixed filling is satisfactorily flowable and perfectly fulfils the task of pressure distribution. In the case of a very dense arrangement of the balls, there would be a filling factor of approximately 70%, and this effects an adequately low thermal resistance. The electric current can be conducted partly or largely via the lateral surface 13. The mixed filling is particularly well suited for a wide temperature range, for example from −40° C. to 150° C.

A homogeneous pressure delivery over the entire lower pressure surface 11b can now be achieved by skillful shaping and dimensioning of the edge region 13, 14. A preferred exemplary embodiment with a lateral surface 13 which is inwardly cambered in the shape of a circular arc and symmetrical with respect to the dashed center line is to be seen in FIG. 3. The force transmission via the side wall 13 may be assumed to be negligible. The hydrostatic pressure p effects along the inner height d a radially outwardly directed force acting on the lateral surface 13, which is half supported in each case at the support bearing points A and B of the circular arc. The force f acting in the circular arc per unit length of the cylinder circumference is, however, directed tangentially at the angle α at which the lateral surface meets the pressure surfaces 11a, 11b, and therefore also has in addition to the radial component $f_R$ a vertical component or supporting force per unit length $f_A$. It is an aim of the invention to dimension $f_A$ such that the resulting force $p_A$ on an edge strip 14 of width l is equal to the hydrostatic pressure p. The equations $$f_R = f \cdot \sin(\alpha) = p \cdot d/2 \text{ and} \quad (1)$$

$$f_A = f \cdot \cos(\alpha) = P_A \cdot 1 \quad (2)$$

yield an edge strip width of $$1 = d/(2 - \tan(\alpha)) \quad (3)$$

for an inner height d and an angle α.

The angle α is advantageously selected in the range between 30° and 60°, in particular equal to 45°. The resulting camber in the lateral surface 13 is then, on the one hand, large enough for a good stability to be achieved even with low wall thicknesses, and to absorb an edge load from above because the flexibility, and, on the other hand, small enough to keep the tangential force f within bounds for the desired supporting force $f_A$.

A typical dimensioning of the pressure-equalizing box 10 may be given as an example: diameter=100 mm, overall height=10 mm, α=45°, wall thickness or the upper and lower pressure surfaces 11a, 11b, respectively, =3 mm and 2 mm. It is then the case that the inner height d=5 mm and the edge strip width l=2.5 mm.

Figure 3:
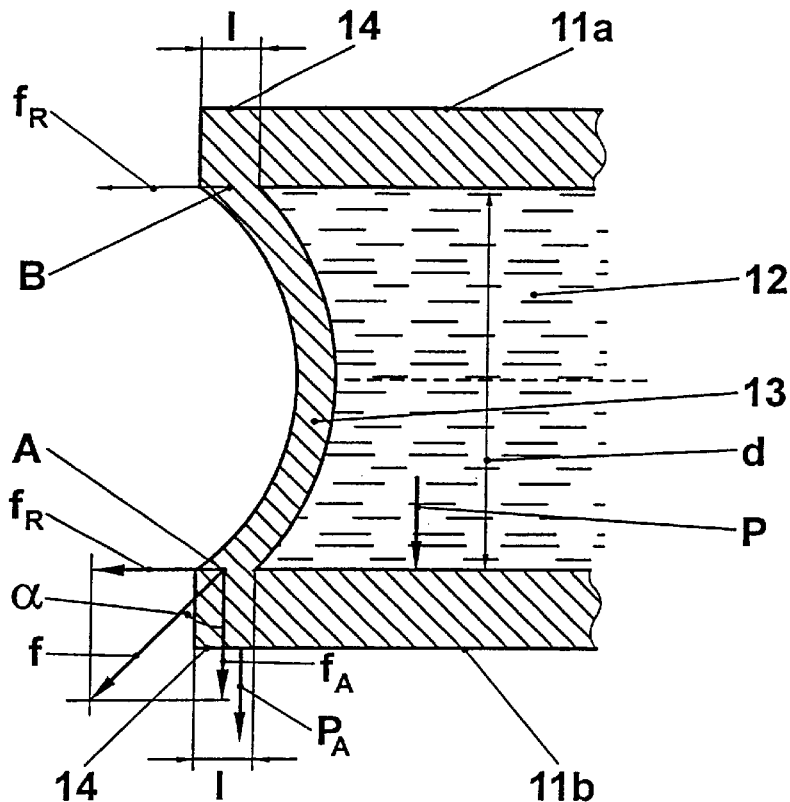
FIG. 3 shows a section through an edge region of the pressure-equalizing element in accordance with FIG. 2, with an inwardly curved, circular lateral surface.
Figure 4:
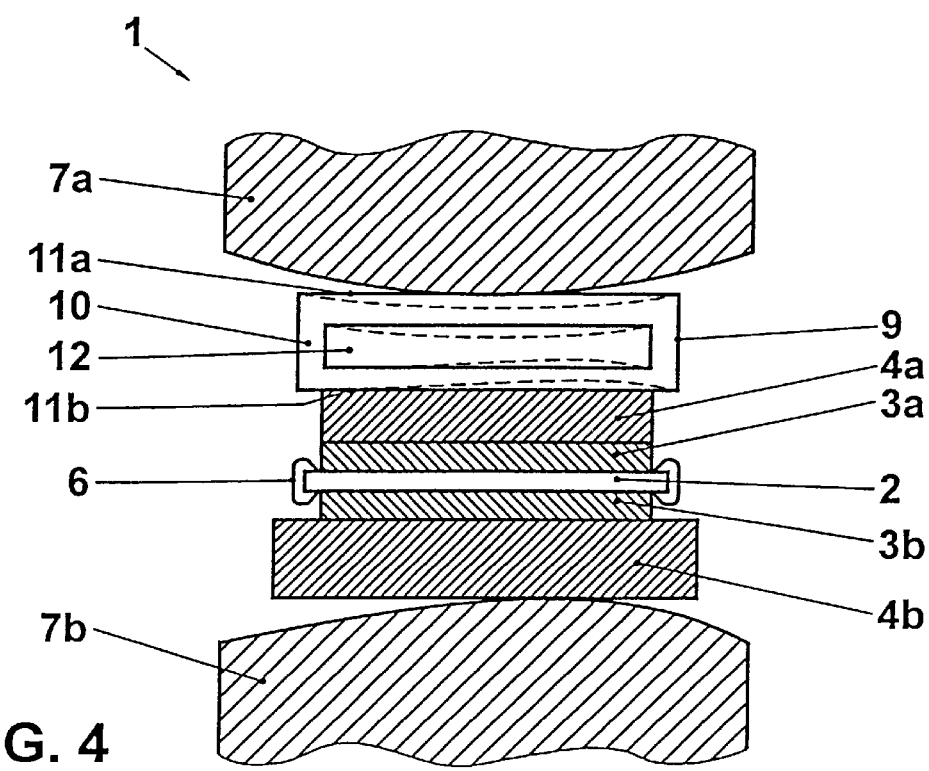
FIG. 4 shows a section through a power semiconductor component with a pressure-equalizing element according to the invention arranged on one side.

The mode of operation of a pressure-equalizing element 9 in accordance with FIG. 3 is represented in FIG. 4 in a power semiconductor component 1 in accordance with FIG. 1. If, for example, the upper pressure plunger 7a is convexly curved, the upper pressure surface 11a is loaded very unevenly, in the extreme case even only at a point, and there is produced in the medium 12 a pressure which spreads homogeneously on all sides within the scope of the flowability of lateral displaceability of the medium 12, and is transmitted in an equally distributed fashion to the lower pressure surface 11b. Inhomogeneous pressure distributions acting from below can be absorbed in a similar way by a second pressure-equalizing element 9 (not represented) which is arranged, for example, between the pressure plunger 7b and the contact plate 4b. The pressure elements 9 can also be inserted at other locations, in particular between a contact plate 4a, 4b and a molybdenum disk 3a, 3b or instead of a contact plate 4a, 4b. A particularly simple design results when the pressure surface 11a, 11b, bearing against the semiconductor wafer 2, of the pressure-equalizing element 9 is constructed as a molybdenum disk 3a, 3b. Separate molybdenum disks 3a, 3b are then superfluous. The pressure-equalizing elements 9 can also replace the contact plates 4a, 4b or all the pressure contact elements 3a, 3b, 4a, 4b. The second pressure-equalizing element 9 is advantageously selected to be thinner than the first, in order to keep its thermal resistance lower and to ensure effective cooling of the power semiconductor 2.

As represented in FIG. 4, however, a single pressure-equalizing element 9 arranged on one side, for example at the top, can homogenize a nonuniform pressure distribution acting from below. If, for example, the lower pressure plunger 7b is convexly curved, the semiconductor wafer 2 and the pressure contact elements 3a, 3b, 4a, 4b, in particular the molybdenum disks 3a, 3b and contact plates 4a, 4b, can also adopt the curvature and transmit it to the pressure-equalizing element 9. A precondition for this is good flexibility of all the elements 4b, 3b, 2, 3a, 4a. This requirement can be fulfilled by selecting sufficiently thin molybdenum disks 3a, 3b and contact plates 4a, 4b, since the semiconductor wafer 2 is generally very flexible. Moreover, in this case the lower pressure surface 11b must also be designed to be flexibly deformable, in order to remove the mechanical deformation, as previously shown. For this purpose, the bottom 11b of the pressure-equalizing element 9 is selected to have sufficiently thin walls, and the side wall 13 is selected to be sufficiently flexible and/or the filling medium 12 is selected to be sufficiently compressible. In this case, therefore, a pressure load which is inhomogeneous on both sides is transformed into a homogeneous pressure distribution over the semiconductor wafer 2 by means of a pressure-equalizing element 9 which is arranged on one side and has at least one elastically deformable pressure surface 11a or 11b. In addition, there is the advantage here that no requirements, or only a substantially reduced number thereof, are placed on the thermal conductivity of the pressure-equalizing element 9, because the heat can be dissipated via the other side of the power semiconductor component 1.

Figure 5A:
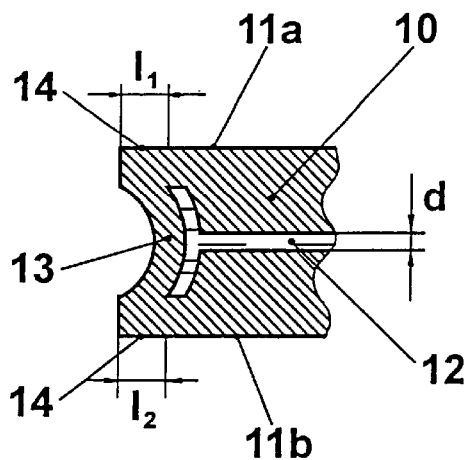
FIG. 5 shows alternative configurations of the lateral surface of the pressure-equalizing element in accordance with FIG. 2.

FIGS. 5a–5d show alternative embodiments of the lateral surface of the pressure-equalizing element 9. An exemplary embodiment according to FIG. 5a is distinguished by a thick-walled bottom and cover and a low inner height d of typically<1 mm. The slot-shaped interior to be filled extends between the pressure surfaces 11a, 11b and along the lateral surface 13, in order to ensure a homogeneous pressure loading of the side wall 13, and thus a uniform pressure distribution, discussed in the case of FIG. 3, on the edge strip 14. An advantage of this arrangement consists in the reduced thermal resistance because of the reduced thickness of the medium 12.

Figure 5B:
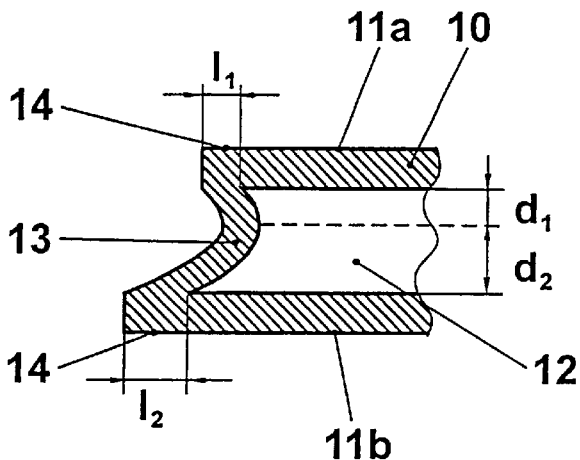

FIG. 5b shows an exemplary embodiment having an asymmetric, arcuate lateral surface 13 and pressure surfaces 11a, 11b of different size. Here, as well, it is desirable to achieve uniform pressure distributions over the entire pressure surfaces 11a and 11b. By analogy with the derivation of equation (3), the considerations according to the invention lead to two independent conditions for the widths 11 and 12 of the upper and lower edge strips 14. For given angles $\alpha_1$ and $\alpha_2$ at which the lateral surface 13 meets the upper and lower pressure surfaces 11a, 11b, and given inner heights $d_1$ and $d_2$, which are to be measured from a waist of the box 10 as far as the cover 11a and bottom 11b, the box 10 is to have edge strips 14 of width $$l_1 = d_1/\tan(\alpha_1) \text{ and} \quad (4)$$

$$l_2 = d_2/\tan(\alpha_2) \quad (5).$$

The entire inner height is $d=d_1+d_2$. Equations (4) and (5) also hold equally for a V-shaped lateral surface 13. As previously, it is favorable if the angles are in the range of 30°<$\alpha_1$, $\alpha_2$<60°, and are preferably $\alpha_1=\alpha_2=45°$. In particular, by selecting the angles to be $\alpha_1 \neq \alpha_2$, or selecting the inner heights to be $d_1 \neq d_2$, it is possible to achieve enlargement or reduction of the pressure surfaces 11a, 11b relative to one another while maintaining a homogeneous pressure loading, and this can be favorable on structural grounds.

Figure 5C:
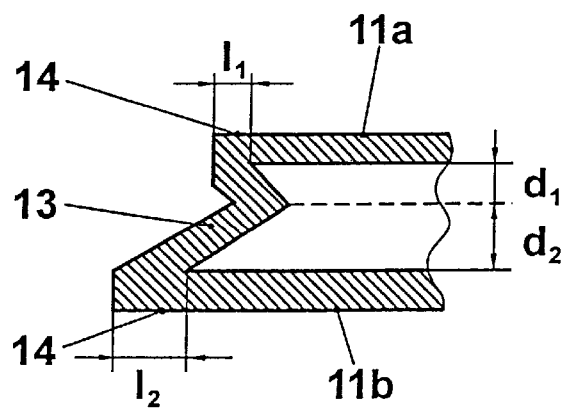
Figure 5D:
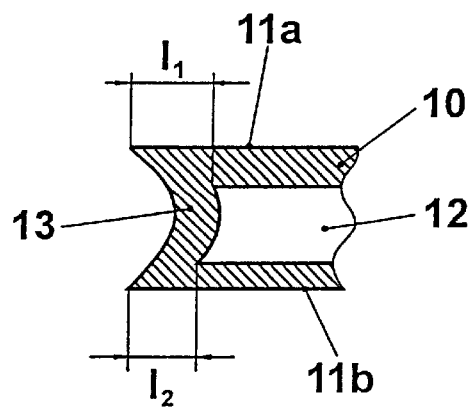

Finally, FIGS. 5c and 5d show further exemplary embodiments with a V-shaped inwardly cambered lateral surface 13 or sharp outer edges. Other shapes of the lateral surface 13, in particular a cylindrical one represented in FIG. 2, are conceivable. The box 10 advantageously has a rotationally symmetrical lateral surface 13 which is inwardly cambered, in particular in the shape of a circle, arc or V or in some other way.

Figure 6:
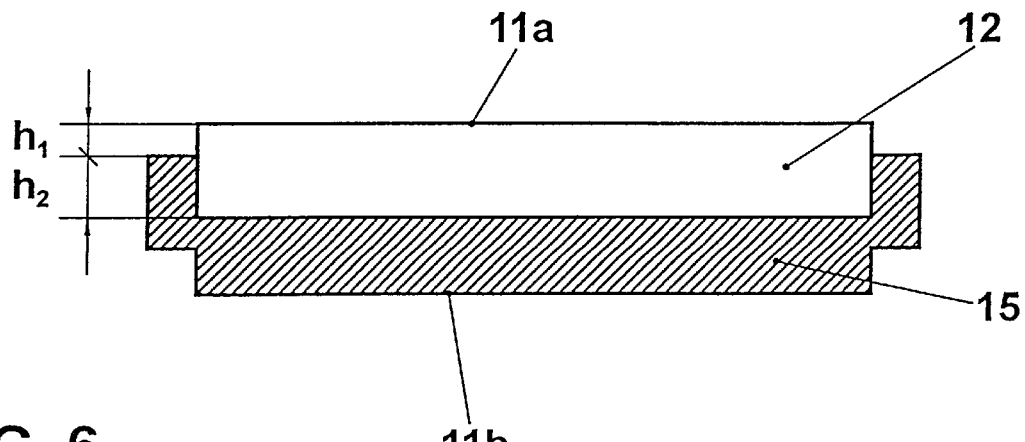
FIG. 6 shows a section through a variant of the pressure-equalizing element according to the invention in accordance with FIG. 2.

A further variant of the pressure-equalizing element 9 according to the invention is represented in FIG. 6. A relatively soft, plastically deformable medium 12 is partially or completely held in an open box or trough 15 made from a hard material. The soft medium 12 forms the upper pressure surface 11a, and the bottom of the trough 15 forms the lower pressure surface 11b. The trough 15 can additionally contain still further, possibly harder media 12. It is favorable for the purpose of a homogeneous pressure distribution over the entire surface if the soft medium 12 projects beyond the edge of the trough 15. The projecting height $h_1$ of the medium 12 is to be selected in this case to be smaller than the trough depth $h_2$, in order largely to prevent the medium 12 from being deflected laterally under pressure. The soft medium 12 is matched to the pressure inhomogeneities by plastic deformation, and thus permits pressure equalization over the entire pressure surface 11a. The material for the open box 15 must be distinguished by great hardness and good electric conductivity. Also desirable are good thermal conductivity and low coefficients of thermal expansion matched to the power semiconductor 2. Particularly suitable are AlSiC, molybdenum or tungsten. One or more of the previously named plastic materials, in particular aluminum, or copper come into consideration as medium 12.

The abovenamed exemplary embodiments can be generalized in numerous ways.

The pressure contact housing is fitted with at least one power semiconductor 2, such as a thyristor, GTO, MCT, power diode, IGBT or MOSFET, for example, but can also contain other circuit components. A number of the power semiconductors 2 is selected in accordance in each case with the required switching capacity. In particular, several power semiconductors 2 can be stacked one above another and/or arranged next to one another. The arrangement next to one another is of interest, in particular, for a parallel circuit of several IGBTs, since it has been possible to date to produce the latter only with relatively small actively controllable surfaces. In this case, a power semiconductor component 1 can contain one or more pressure-equalizing elements 9 or boxes 10, 15 which are arranged on one side or both sides of one or more power semiconductors 2. In particular, a pressure-equalizing element 9 can be arranged in each case on both sides of power semiconductors 2 stacked one above another and/or arranged next to one another.

The shape of the box 10, 15 can be varied at will, if it has two pressure surfaces 11a, 11b for absorbing and passing on the pressure from a pressure plunger 7a, 7b to at least one power semiconductor 2. The pressure surfaces 11a, 11b are preferably flat and parallel to one another.

The pressure plungers 7a, 7b are to be in thermal contact with a heat sink. They are favorably themselves designed as heat sinks, in which case they are equipped with, for example, ribs for air cooling or with a milled-in spiral for liquid cooling.

In addition to the advantages mentioned at the beginning, a pressure-equalizing element 9 according to the invention has the following advantages, in particular. Both intrinsic, local pressure inhomogeneities and also global ones impressed from outside are removed. As a result, the mechanical tolerances of the entire power semiconductor component 1 can be more generously dimensioned, and the failure rate can be lowered.

In conventional power semiconductor components 1, the contact force weakens after excessive pressure loads or owing to material fatigue. This problem is largely pushed into the background because of the elasticity of the pressure-equalizing element 9.

The pressure-equalizing element 9 can additionally assume the function of the currently employed pressure contact elements 3a, 3b, 4a, 4b, in particular of the molybdenum disks 3a, 3b and contact plates 4a, 4b. The conventional pressure contact elements (3a, 3b, 4a, 4b) can then be replaced individually or jointly by pressure-equalizing elements 9. In this case, the known advantages of flexible pressure contact, in particular a simple design, a simple possibility of replacement for structural elements or components, and a very high thermal loadability are safeguarded.

Overall, it is possible by means of the invention to extend the field of application of pressure contact housings for electric and also thermal contact of power semiconductors 2, and to increase the reliability and safety of such power semiconductor components 1.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United Sates is:

1. A power semiconductor component having at least one power semiconductor and pressure plungers for making contact with the power semiconductor, wherein
   a) at least one electrically conductive pressure-equalizing element is arranged between the power semiconductor and the pressure plungers, and
   b) the pressure-equalizing element comprises a box which is filled with a flowable or plastically deformable medium.

2. The power semiconductor component as claimed in claim 1, wherein
   a) the medium has a compressibility of between incompressible and slightly compressible, and
   b) the medium is electrically and thermally conductive.

3. (Twice Amended) The power semiconductor component as claimed in claim 1, wherein
   a) the box has upper and lower pressure surfaces and a rotationally symmetrical or cylindrical lateral surface,
   b) the pressure surfaces are planar and parallel to one another, and
   c) the box is electrically conductive.

4. The power semiconductor component as claimed in claim 3, wherein
   a) the medium is one of i) a liquid metal, ii) a plastic metal, iii) metal balls in a thermally conducting liquid and iv) metal balls in a thermally conductive paste,
   the box comprises at least one of a cover, a bottom and a trough wall made from a thermally conductive material with a coefficient of thermal expansion matched to the power semiconductor.

5. The power semiconductor component as claimed in claim 3, wherein
   a) a lateral surface of the box is cambered inwards in a shape that is one of an arc and a V, b) the lateral surface meets the upper pressure surface at an angle $\alpha_1$ and meets the lower pressure surface at an angle $\alpha_2$, c) the box has an inner height $d_1$ measured from a waist of the box to an inner surface of the upper pressure surface and an inner height $d_2$ measured from the waist to an inner surface of the lower pressure surface, d) the box has upper and lower edge strips having respective widths of $$l_1 = d_1/\tan(\alpha_1) \text{ and}$$

$$l_2 = d_2/\tan(\alpha_2)$$

and e) the angles $\alpha_1$ and $\alpha_2$ are in the range of $30° < \alpha_1$, $\alpha_2 < 60°$.

6. The power semiconductor component as claimed in claim 5, wherein the box has a slot-shaped interior which extends between the pressure surfaces and along the lateral surface.

7. The power semiconductor component as claimed in claim 1, wherein a) the box comprises a trough made from a hard material, b) a soft, plastically deformable medium is held in the trough, and c) the soft, plastically deformable medium forms the upper pressure surface.

8. The power semiconductor component as claimed in claim 1, wherein a) at least one of the at least one power semiconductor is one of a thyristor, a GTO, a MCT, a power diode, an IGBT and a MOSFET, b) the box comprises at least one of a cover, a bottom and a trough made from a material which is one of AlSiC, molybdenum and tungsten, and c) the medium is one of mercury, lead, gallium, tin, aluminum, indium, copper, copper balls in silicone oil and copper balls in silicone vaseline.

9. The power semiconductor component as claimed in claim 1, wherein a plurality of pressure-equalizing elements are arranged on at least one side of at least one of the at least one power semiconductor.

10. The power semiconductor component as claimed in claim 4, wherein a) the at least one power semiconductor is arranged between a first pressure-equalizing element and a second pressure-equalizing element, and b) the first and second pressure-equalizing elements replace pressure contact elements.

11. The power semiconductor component of claim 4, wherein at least a portion of the box is made of a metal.

12. The power semiconductor component of claim 4, wherein at least a portion of the box is made of a metal ceramic.

13. The power semiconductor component of claim 5, wherein $\alpha_1 = \alpha_2 = 45°$.

14. A pressure contact housing suitable for a power semiconductor component having at least one pressure contact element, wherein at least one of the at least one pressure contact element is a box which is filled with a plastically deformable medium.

15. A pressure contact element suitable for a pressure contact housing of a power semiconductor component, wherein the pressure contact element is a box which is filled with a plastically deformable medium.

* * * * *